(12) United States Patent
Frederick, Jr. et al.

(10) Patent No.: US 8,959,472 B1
(45) Date of Patent: Feb. 17, 2015

(54) CONSIDERING COMPATIBILITY OF ADJACENT BOUNDARY REGIONS FOR STANDARD CELLS PLACEMENT AND ROUTING

(71) Applicant: ARM Limited, Cambridge (GB)

(72) Inventors: Marlin Wayne Frederick, Jr., Austin, TX (US); Jean-Luc Pelloie, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/039,224

(22) Filed: Sep. 27, 2013

(51) Int. Cl.
*G06F 17/50* (2006.01)

(52) U.S. Cl.
CPC ........ *G06F 17/5072* (2013.01); *G06F 17/5077* (2013.01)
USPC ............ 716/122; 716/119; 716/132; 716/135

(58) Field of Classification Search
USPC .................................. 716/119, 122, 132, 135
See application file for complete search history.

(56) References Cited

U.S. PATENT DOCUMENTS

| | | | | |
|---|---|---|---|---|
| 7,028,285 B2 * | 4/2006 | Cote et al. | ........................ | 716/55 |
| 7,378,195 B2 * | 5/2008 | Graur et al. | ........................ | 430/5 |
| 7,653,884 B2 * | 1/2010 | Furnish et al. | ................ | 716/103 |
| 7,989,849 B2 * | 8/2011 | Sherlekar et al. | ............. | 257/207 |
| 8,136,072 B2 * | 3/2012 | Frederick | ....................... | 716/119 |
| 8,255,837 B2 * | 8/2012 | Lu et al. | .......................... | 716/50 |
| 8,423,946 B1 * | 4/2013 | Jin et al. | ........................ | 716/133 |
| 8,631,366 B2 * | 1/2014 | Hou et al. | ...................... | 716/110 |
| 8,631,383 B2 * | 1/2014 | Wagner | ......................... | 716/138 |
| 8,661,392 B2 * | 2/2014 | Quandt et al. | ................. | 716/122 |
| 2007/0150846 A1 * | 6/2007 | Furnish et al. | .................... | 716/8 |
| 2008/0184188 A1 * | 7/2008 | Martin et al. | ................... | 716/14 |
| 2010/0115484 A1 | 5/2010 | Frederick | | |
| 2010/0196803 A1 * | 8/2010 | Lu et al. | ........................... | 430/5 |
| 2010/0281446 A1 * | 11/2010 | Hou et al. | ........................ | 716/6 |
| 2011/0084312 A1 * | 4/2011 | Quandt et al. | ................. | 257/202 |
| 2013/0074029 A1 * | 3/2013 | Blatchford | .................... | 716/127 |
| 2013/0086536 A1 * | 4/2013 | Kim et al. | ....................... | 716/55 |

* cited by examiner

*Primary Examiner* — Naum B Levin
(74) *Attorney, Agent, or Firm* — Nixon & Vanderhye P.C.

(57) ABSTRACT

A method of generating an integrated circuit layout comprises a step of determining a placement of standard cells selected from a standard cell library while permitting boundary conflicts in which incompatible boundary regions of standard cells are placed next to each other. After determining routing connections between the standard cells, the integrated circuit layout is generated. The generation of the integrated circuit layout includes a mapping step of mapping at least one incompatible boundary region to an alternative boundary region to resolve at least one boundary conflict.

16 Claims, 6 Drawing Sheets

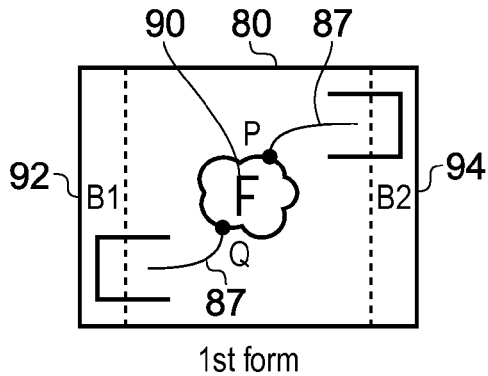
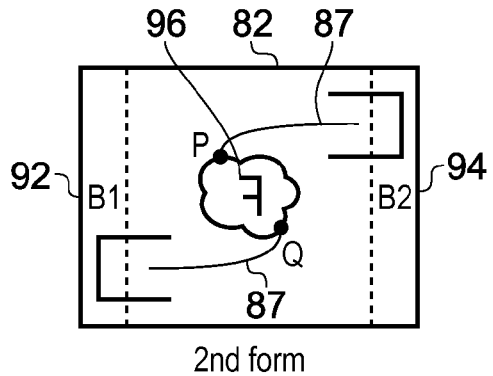
1st form        2nd form
FIG. 5A        FIG. 5B
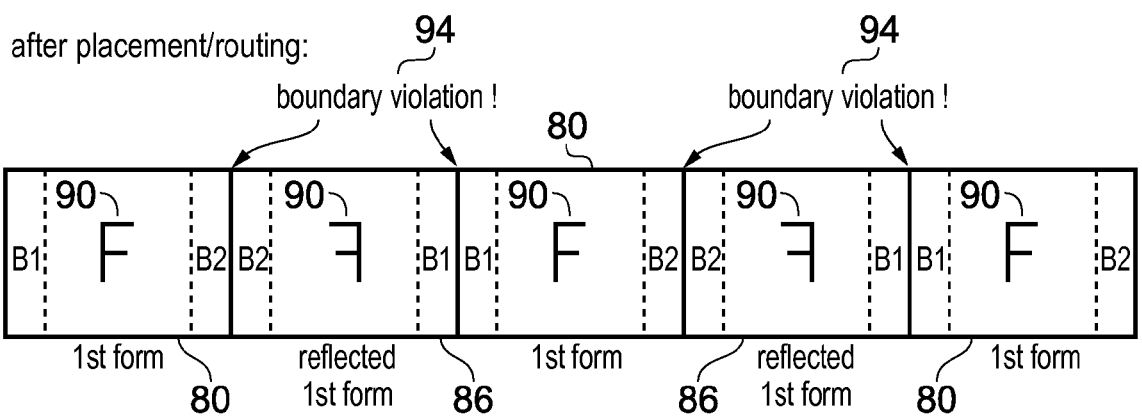
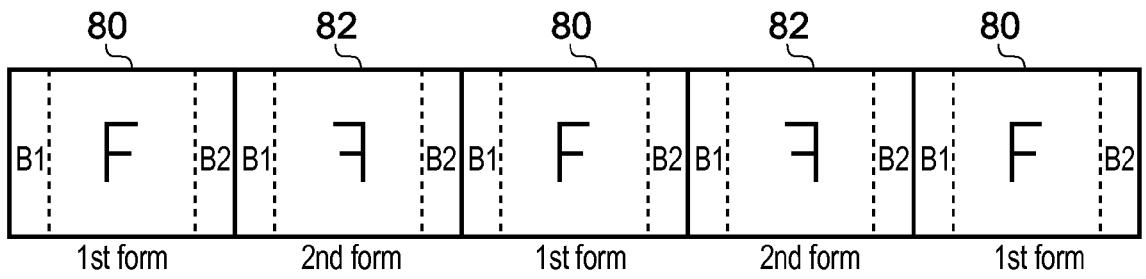
FIG. 6

CONSIDERING COMPATIBILITY OF ADJACENT BOUNDARY REGIONS FOR STANDARD CELLS PLACEMENT AND ROUTING

TECHNICAL FIELD

The present invention relates to the field of integrated circuits. More particularly, the invention relates to a method of generating an integrated circuit layout.

BACKGROUND

Automated tools may be provided for generating an integrated circuit layout. A standard cell library defines different types of standard cells which can be selected for inclusion in the integrated circuit layout. The system designer can provide the automated design system with a functional definition of the circuit layout to be generated, and the automated design system can then generate an integrated circuit layout by selecting standard cells from the library which satisfy the required functional definition.

It is known to provide some standard cells which have boundary regions which have limited compatibility with boundary regions of adjacent cells. Some cells may have boundary regions which are incompatible with each other, so that such cells cannot be placed next to each other in the integrated circuit layout. The automated design system may therefore consider compatibility of adjacent boundary regions when determining a cell placement for the integrated circuit. For example, the system may select the cells so that only cells with compatible boundary regions are placed next to each other. However, this limits flexibility in cell placement and routing of connection to the cells, which can reduce the efficiency of the circuit layout. Also, it is possible to place filler regions between incompatible boundary regions of adjacent cells so that these cells may still be placed next to each other. However, the filler regions increase the area of the integrated circuit layout, which is undesirable. The present technique seeks to address these problems.

SUMMARY OF THE INVENTION

Viewed from one aspect, the present invention provides a computer-implemented method of generating an integrated circuit layout using a standard cell library defining a plurality of standard cells, each standard cell defining a potential functional component for including in the integrated circuit layout;

the method comprising steps of:

determining a placement of standard cells selected from the standard cell library while permitting one or more boundary conflicts in which incompatible boundary regions are placed adjacent to each other in adjacent standard cells of the placement, the incompatible boundary regions comprising boundary regions that cannot be placed adjacent to each other in the integrated circuit layout;

determining routing connections between the standard cells in the placement; and generating the integrated circuit layout based on the placement and the routing connections, wherein said generating comprises a mapping step in which, for at least one of the boundary conflicts, at least one of the incompatible boundary regions in the placement is mapped to an alternative boundary region in the integrated circuit layout to resolve the boundary conflict.

The method determines a placement of standard cells selected from the cell library while permitting one or more boundary conflicts in which incompatible regions are placed adjacent to each other in adjacent standard cells of the placement. This is in contrast to known systems which would not allow such placement with boundary conflicts. A mapping step is provided later in the layout generation method in which, for at least one of the boundary conflicts, at least one of the incompatible boundary regions in the placement is mapped to an alternative boundary region to resolve the boundary conflict. This technique provides several advantages. By providing the mapping step subsequent to placement and routing, the placement and routing steps become less complex as they do not need to consider compatibility of boundary regions of adjacent cells. Also, this technique allows for greater flexibility in choosing which cells are placed in the cell placement, which may permit better routing of connections between the standard cells for example. Also, by placing the standard cells while permitting boundary conflicts, but later mapping incompatible boundary regions to alternative boundary regions to resolve the conflicts, it is possible to place the standard cells without using a filler region between incompatible boundary regions, thus reducing the area of the eventual integrated circuit layout.

The step of determining the placement of standard cells may include placing a reflected cell in the placement, the reflected cell comprising a reflected version of a selected standard cell from the standard cell library. Providing the ability to reflect cells from the library when placing them in the placement is useful because this can allow connections to be routed to the cell more efficiently, freeing space for other routings. However, if the cell to be reflected has different boundary regions at different edges of the cell, then reflecting the cell may introduce boundary conflicts which would not have been present if the cell had not been reflected since the reflection may cause the boundary regions to be exchanged in position. Hence, in known integrated circuit layout design, it has been difficult to introduce reflected cells without also requiring filler regions to be added to resolve boundary conflicts. In contrast, the present technique can permit such boundary conflicts caused by reflected cells in the placement, and then subsequently map incompatible boundary regions to alternative boundary regions to resolve the conflict once the placement and routing has been determined. Hence, the benefits of the reflected cell placement can still be achieved without complicated modification of the cell placement step or routing step and without filler regions increasing the circuit area. The reflection of the cell may be about any axis. For example, the reflection may be about an axis which divides the cell in two horizontally, vertically or diagonally.

In the placement step, the standard cells may be placed with incompatible boundary regions directly abutting each other. Hence, the boundary conflict does not constrain the cell placement, and the conflict can be resolved later by the mapping step.

Some cells may only have a boundary region on one side of the cell which could cause boundary conflicts with other cells. Other cells may have such boundary regions on two or more sides of the cell. Hence, some cells may have boundary conflicts arising at multiple edges of the cell.

It is possible for the mapping step to map only the boundary region of a standard cell to an alternative boundary region while leaving the rest of the standard cell alone. However, as the interconnections between the boundary region and the rest of the cell may be complex, it may be simpler to replace the entire standard cell having the incompatible boundary region with an alternative standard cell which includes the alternative boundary region and corresponds to the same functional component as the original standard cell. For example, the cell library may define multiple versions of standard cells corresponding to the same functional component, with each version having a different arrangement of boundary regions. The mapping step can then replace a target standard cell with one of its alternative versions to resolve the boundary conflict.

It can be particularly useful to provide an alternative standard cell having boundary regions at opposite edges of the standard cell which are the other way round to the corresponding boundary regions of the target standard cell. Hence, if the target standard cell has a first boundary region at a first edge and a second boundary region at a second edge, the alternative standard cell may have the first boundary region at the second edge and the second boundary region at the first edge, but the same functional component as the target standard cell. This is useful in the case where the target standard cell is a reflected version of a cell from the library as discussed above. If reflection of the cell has caused boundary conflicts at one or both of the first and second edges, then often replacing the target standard cell with the alternative standard cell with the boundary regions the other way round may resolve the conflict(s).

Hence, for a given functional component, it can be useful for the cell library to contain characterising information defining two different versions of a standard cell for the same component. A first version has a first boundary region at one edge, a second boundary region at an opposite edge and a given functional component between the two edges. The alternative version has the functional component reflected compared to the first version but the boundary regions in the same place as the first version. The target standard cell discussed above may correspond to a reflected form of the first version and so the library would not need to contain further characterising data defining this reflected form as the first version can implicitly identify the reflected target standard cell. Hence, boundary conflicts introduced by reflecting the first version of the cell to produce the target standard cell for the placement can be resolved by replacing the target standard cell with the second version of the cell at the mapping stage.

Often, cells may have multiple edges with boundary regions of limited compatibility. In this case, replacing a standard cell at the mapping step to resolve one boundary conflict could introduce another conflict at another edge of the replaced cell. Therefore, it may sometimes be required to replace multiple standard cells of the placement with alternative cells to resolve boundary conflicts which have rippled through from other cells when other boundary conflicts have been resolved.

A boundary conflict may be caused when two incompatible boundary regions are placed adjacent to each other. It may be sufficient to replace only one of the incompatible boundary regions in order to resolve a boundary conflict. For example, one of the incompatible boundary region may be replaced with an alternative boundary region which is compatible with the other of the incompatible boundary regions. On other occasions, it may be simpler to replace both of the incompatible boundary regions with alternatives which are compatible. For example, depending on other boundary regions of the cells including the incompatible boundary regions, it may be preferable to replace both incompatible boundary regions with alternatives, for example if replacing only one would cause other boundary conflicts to ripple through to other cells as discussed above.

The mapping step may be performed at various stages of the method of generating the integrated circuit layout. In one example, the mapping step may be performed at a "streamout" step for outputting the integrated circuit layout for design rule verification or manufacturing rule verification. Design or manufacturing rule verification may comprise various checks for ensuring that the generated integrated circuit layout will function correctly when manufactured. It is advantageous to perform the mapping step at the streamout stage, because at this point less data is required to characterise the placed cells than at the placement or routing stage. If the mapping step using alternative versions of standard cells as discussed above had been performed at the placement or routing step, then this would require each version of the cell to be modelled fully for placement/routing, which would increase the volume of data and complexity of the standard cell library. However, at the streamout step, the alternative versions of cells can be defined using less data, making the cell library's implementation more efficient.

In some examples, there may only be two different types of boundary regions. For example, boundary regions of opposite types may considered compatible with each other while boundary regions of the same type may be considered incompatible. In this case, the computer implemented design may need little information characterising compatibility of the boundary regions other than an indication of which boundary type is present at each cell boundary.

However, in other examples there may be more than two types of boundary regions, and determining whether different types of boundary regions are compatible may be more complex. Therefore, the method may use compatibility information to indicate the compatibility of the different boundary regions of different types. The mapping step may identify boundary conflicts and determine alternative boundary regions based on the compatibility information.

Although the present technique provides an improved technique for handling conflicts between incompatible boundary regions of adjacent standard cells, it is not essential to use this technique for every boundary conflict arising in the cell placement. For some boundary conflicts it may be possible to use a known technique such as inserting a filler region between the boundaries or by adjusting the cell placement to avoid the boundary conflict in the first place. Hence, it is possible to use the mapping step for only some of the boundary conflict arising in the cell placement.

The method may comprise a step of outputting the generated layout. For example, the generated layout may be output by storing it on a recording medium or outputting it to an external device. A manufacturer may then manufacture the integrated circuit having the generated integrated circuit layout.

Viewed from another aspect, the present invention provides a computer-readable storage medium storing a standard cell library comprising information defining a plurality of standard cells for inclusion in an integrated circuit layout, each standard cell comprising a first edge and a second edge opposite the first edge;

said plurality of standard cells comprising:

a first standard cell comprising a first boundary region at the first edge, a second boundary region at the second edge and a predetermined functional component between the first edge and the second edge; and a second standard cell comprising the first boundary region at the first edge, the second boundary region at the second edge, and a reflected version of the predetermined functional component between the first edge and the second edge.

To enable boundary conflicts to be resolved between incompatible boundary regions of standard cells, a standard cell library may comprise first and second versions of standard cells having the same functional component. The first version may have a first boundary region at a first stage, a second boundary region at a second edge opposite the first edge and a predetermined functional component between the first and second edges. The second standard cell has the boundary regions in the same positions relative to the first and second edge as the first standard cell but with the functional component reflected relative to the corresponding functional component in the first standard cell (e.g. the functional component may be reflected about an axis dividing the cell in two horizontally, vertically or diagonally).

In some examples, the placement step in the design of the integrated circuit layout may have available for selection both the first and second versions of the standard cell. In this case the cell library may comprise control information for controlling placement and connection routing for both the first and second standard cells. In this case, boundary conflicts may be avoided at the placement step by inserting the flipped second standard cell instead of a reflected version of the first standard cell.

On the other hand, in other examples only the first standard cell may be available for placement and routing (whether in non-reflected or reflected form), and the second standard cell may then replace the reflected version of the first standard cell at a subsequent mapping step for resolving boundary conflicts. In this case, the standard cell library may comprise a control information for controlling placement and connection routing for the first standard cell only, but not the second standard cell. This approach may be more efficient as the amount of characterising data for defining the second standard cell can be reduced by inserting it at a later stage of the layout generation process rather than requiring the model of the cell to be fully duplicated at the placement/routing stage.

The storage medium storing the cell library may be a non-transitory storage medium such as a random access memory, flash memory, a magnetic storage medium or optical disk, for example.

Further aspects, features and advantages of the present technique will be apparent from the following description of example embodiments, which is to be read in conjunction with the accompanying drawings.

BRIEF DESCRIPTION OF THE DRAWINGS

FIGS. 5A and 5B schematically illustrate first and second forms of a standard cell;

FIG. 6 shows a first example of mapping one or more incompatible boundary regions to alternative boundary regions;

DESCRIPTION OF EXAMPLE EMBODIMENTS

Figure 1A:
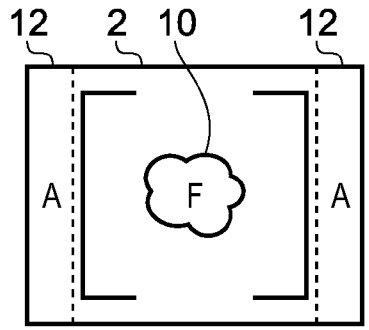
FIGS. 1A to 1D illustrate examples of standard cells with different types of boundary regions.

FIGS. 1A to 1D illustrate four examples of standard cells 2, 4, 6, 8 for potential inclusion in an integrated circuit layout.

Each standard cell comprises functional circuitry 10 which may comprise any component of an integrated circuit. For example, the functional circuitry 10 may be a logic gate such as an AND gate or OR gate, an adder, or a multiplier. The letter F will be used in the drawings to denote the functional component. Each standard cell includes boundary regions 12 at the edges of the standard cell. While FIGS. 1A to 1D shows the boundary regions 12 at the left and right edges of the cell, in other examples, there may be boundary regions at the top and bottom edges instead of, or in addition to, the left and right edges.

Figure 1C:
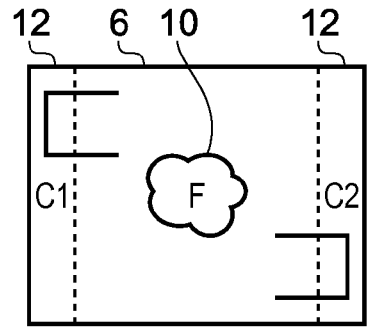
Figure 1B:
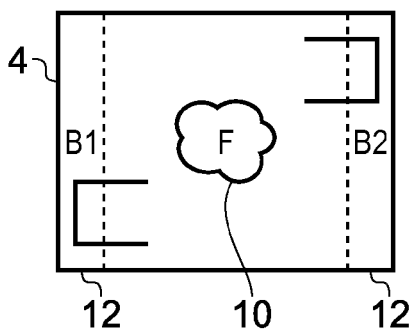
Figure 1D:
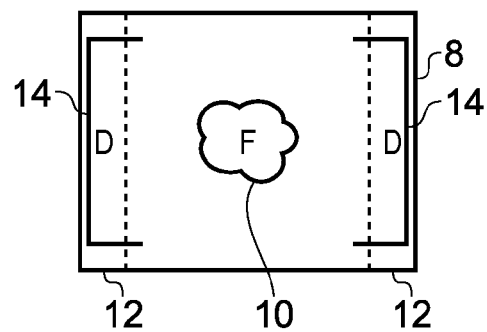

Integrated circuit design rules or other constraints may cause boundary regions 12 of different types to be incompatible with each other so that they cannot be placed abutting each other in the integrated circuit layout. For example, there may be a manufacturing rule which prevents metal lines in the same layer of the cell being closer than a certain minimum distance, to ensure correct functioning of the manufactured circuit for example. Hence, if adjacent cells have boundary regions with metal lines passing close to the edge of the cell, this could conflict with a similar metal line in a boundary region of an adjacent cell, violating the manufacturing rule. FIGS. 1A to 1D show examples of different arrangements of metal lines in the same layer of the cell. In FIG. 1A, the cell 2 has no metal lines in the boundary regions 12 and so its boundary regions 12 may be compatible with any other boundary region 12. However, the cells 4, 6, 8 of FIGS. 1B-1D have metal lines in the boundary regions 12 with different arrangements. If cells are placed next to each other which both have metal lines entering the boundary region 12 at corresponding positions, then this may cause a boundary conflict. For example, the boundary region B1 at the left edge of the standard cell 4 of FIG. 1B is compatible with the boundary region B2 at the right hand edge of an adjacent standard cell 4 of the same type. However, the boundary region B1 would not be compatible with a boundary region C2 as shown in FIG. 1C or a boundary region D shown in FIG. 1D because the adjacent cells would both have a metal line in the lower part of the boundary region which would be closer than the required minimum distance.

While boundary conflicts could be avoided by requiring all cells to avoid metal lines extending in the boundary region as in FIG. 1A, allowing some standard cells to extend into the boundary region is useful because it makes it possible to make cells smaller in width, to increase the functional density of the integrated circuit designed with such cells. Therefore, it can be preferable to use cells for which boundary conflicts can arise.

As well as the arrangement of metal lines or other components of the standard cell extending into the boundary regions 12, there may be other reasons why certain boundary regions of standard cells are incompatible with each other. For example, there may be differences in doping concentration of adjacent regions of semiconductor. More information about different types of cell boundaries is provided in the US patent application US2010/0115484 A1 filed by ARM Limited of Cambridge, UK, the contents of which are incorporated herein by reference.

Figure 2A:
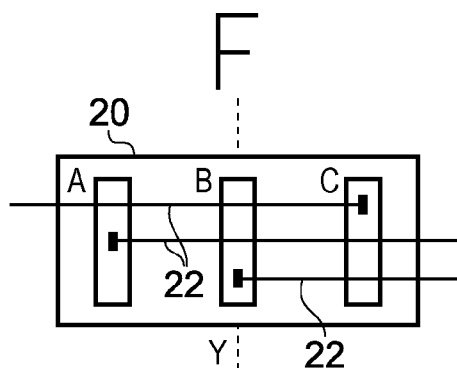
FIGS. 2A and 2B illustrate an example of reflecting a standard cell before placement in an integrated circuit layout.

Sometimes, it may be desirable to reflect a standard cell when placing it in the integrated circuit layout. For example, FIG. 2A shows an example of a standard cell 20 comprising three components A, B, C. In the example of FIG. 2A, the component C needs to be connected to a standard cell to the left of the cell 20, while components A, B need to be connected to the standard cell to the right of cell 20. However, this means that the connections 22 must pass over the other components of the cell 20 to reach the adjacent cells, and so the connections 22 use up much of the space available for routing connections in cell 20.

Figure 2B:
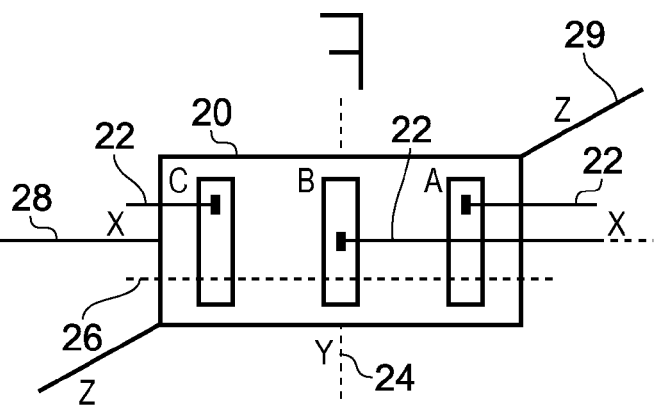

As shown in FIG. 2B, by reflecting the standard cell 20 about the Y axis 24, while routing components A, B, C to the same cells either side of cell 20 as before, then it is no longer necessary for the routed connections to pass over large parts in the cell 20. For example, the reflection means that component C is now closer to the left adjacent cell to which it is to be connected than in FIG. 2A. This means that some of the connections 22 can be shortened, making space 26 for routing additional connections over the standard cell 20 which would not have been possible in FIG. 2A. Hence, flipping the standard cell can be useful when placing the cell in an integrated circuit layout. While FIGS. 2A and 2B show a reflection about the Y axis 24, in other examples, the reflection could be about an X axis 28 or diagonal Z axis 29 as indicated in FIG. 2B, or another axis. Preferably, the reflection may be about an axis which divides the cell 20 in two.

Figure 3:
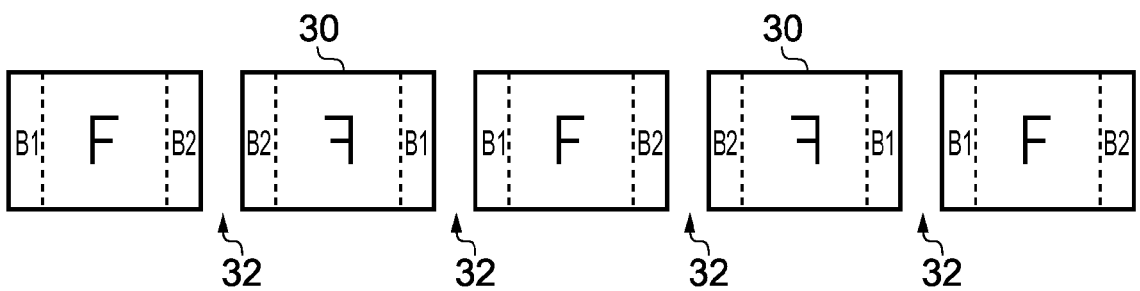
FIG. 3 illustrates an example of boundary conflicts which can arise between boundary regions of adjacent standard cells.

However, if the standard cell to be reflected has boundary regions 12 with limited compatibility with other boundary regions, then reflecting the cell may introduce additional boundary conflicts which would not have occurred if the cell had not been reflected. For example, there may be a row of standard cells of type 4 shown in FIG. 1B in which each cell has a boundary region B1 on the left hand side and a boundary region B2 on the right hand side. In the non-reflected forms of the cells, such cells can be placed adjacent to each other since at each boundary the regions B1 and B2 are compatible with each other (the metal line in the top half of region B2 does not conflict with the metal line in the bottom half of region B1). However, as shown in FIG. 3 if two of the cells 30 are reflected about the Y axis, then the boundary regions B1, B2 are swapped for these cells 30, and so boundary conflicts arise when two of the same regions B1 or the same regions B2 are adjacent to each other. Typically, this problem has been addressed by inserting a space 32 between adjacent cells as shown in FIG. 3, but this increases the area of the integrated circuit. Alternatively, this problem can be addressed by preventing reflection as shown in FIGS. 2A and 2B. However, this limits the design freedom in cell placement and routing, for example eliminating the opportunity to make connection routing more efficient as shown in FIG. 2B. Avoiding reflection may require inputs and outputs for a cell to be routed past each other in complicated ways to reach an appropriate pin.

Figure 4:
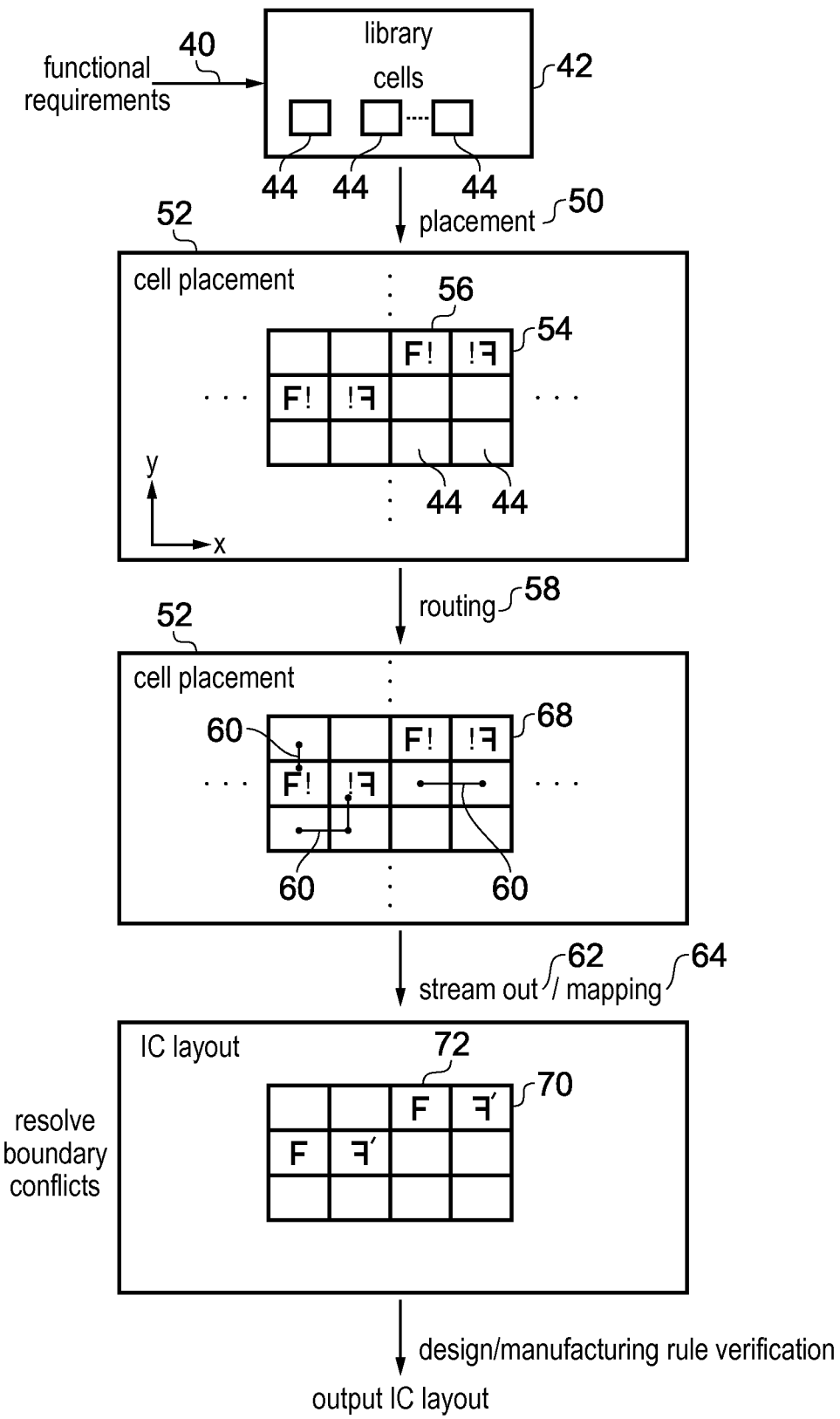
FIG. 4 schematically illustrates an example method of generating an integrated circuit layout using a standard cell library.

FIG. 4 shows a method of generating an integrated circuit layout which permits cells to be flipped on placement without needing to insert additional space between conflicting cells. The method is implemented using a computer, for example an EDA (Electronic Design Automation) tool. The computer may for example be as discussed with respect to FIG. 9 below. A circuit designer specifies some functional requirements 40 for the integrated circuit to be designed. For example, the functional requirements may provide a gate level representation of the desired circuit or use a high level representation of the circuit, such as using Register Transfer Language (RTL). A cell library 42 is provided, for example on a recording medium readable by the computer implementing the method. The cell library 42 includes data defining standard cells 44 each corresponding to a potential functional component to be included in the integrated circuit design. At a placement step 50, standard cells 44 from the library 42 are selected to meet the input functional requirements 40, and a cell placement 52 is generated including the selected cells 44. For example, the cell placement 52 may comprise various rows 54 and columns 56 of cells 44 selected from the library 42. The placement step reflects some standard cells 44 from the library 42 before being placed in the cell placement 52. In the drawings, reflected standard cells are indicated using a backwards letter F, in contrast to non-reflected cells which are indicated using a normal letter F. Unlike previous design processes, the placement step 50 permits cells and reflected cells to be placed so that their boundaries conflict (this is indicated by the explanation mark in FIG. 4). Hence, there is no need for the placement step to consider whether boundaries of adjacent cells are compatible with each other. The placement step 50 places the cells so that their boundaries directly abut each other, without intervening filler regions.

At a routing step 58, various connections 60 between cells are determined. For example, the connections 60 may implement functional relationships between the components represented by different cells of the cell placement 52. At a streamout step 62, the cell placement 52 is streamed out for design rule verification or manufacturing rule verification. The design/manufacturing rule verification comprises one or more steps to check whether the integrated circuit layout generated by the placement and routing steps complies with various rules which govern how the integrated circuit can be manufactured. For example, the verification may check that no two metal lines in the same layer of the cell are closer than a minimum distance, as this could prevent the integrated circuit functioning properly when manufacturing. If the integrated circuit design fails the verification, then it is sent back to the placement step 50 to generate a new placement.

The streamout step 62 includes a mapping step for mapping incompatible boundary regions of the placed cells to alternative boundary regions to resolve boundary conflicts, and hence to generate the final integrated circuit layout. In the example shown in FIG. 4, a target cell 68 of the cell placement 52 is replaced with an alternative cell 70 which has the same functional component as the target cell 68 but with a different boundary region arrangement to avoid a conflict with an adjacent cell 72. By replacing cells with alternative cells at the streamout step 62, the final integrated circuit layout can be generated free from boundary conflicts, without incurring complexity at the cell placement step 50 or increasing circuit area.

To enable the mapping shown in FIG. 4, it is useful to provide the library 42 with alternative forms of a standard cell providing the same functionality, but with different relative positions of elements of the functional component with respect to each other and the boundary regions. One example is shown in FIGS. 5A and 5B. FIG. 5A shows a first form 80 of a standard cell having a predetermined functional component 90 between a first boundary region B1 at a first edge 92 of the standard cell and a second boundary region B2 at a second edge 94 of the standard cell. FIG. 5B shows a second form of the standard cell 82 in which the boundary regions B1 and B2 are still at the first edge 92 and second edge 94 respectively, but in which the functional component 90 is replaced with a reflected functional component 96 which is reflected about the Y axis relative to the functional component 90 in the first form 80 of the standard cell. The reflected functional component 96 need not be an exact mirror image of the functional component 90 in the first form 80. It is sufficient for the reflection to be such that the relative positions of elements of the functional component are flipped (e.g. in the example of FIGS. 2A and 2B component C is to the right of elements A and B in the non-reflected form and to the left of elements A and B in the reflected form). Also, as shown in the example of FIG. 5A, the functional component 90 may have a part P which is to be connected to the boundary region B2 at the right hand edge of the cell and a part Q which is to be connected to the boundary region B1 at the left hand edge. In the second form 82 of the cell, the relative positions of parts P and Q may change as functional component 90 is reflected, but parts P and Q may still need to be connected to the right and left hand edges respectively. Therefore, the connections 87 of the second form 82 of the cell may not be a mirror image of the corresponding connections 87 of the first form 80 of the cell.

FIG. 6 shows an example of how the first form and second form of the standard cell shown in FIGS. 5A and 5B can be useful. As shown in the top part of FIG. 6, at cell placement 50 and routing 52, the first form 80 of the standard cell may be used by the cell library 42 to control cell placement 52. The cell library 42 may choose to include either the first form 80 or a reflected version 86 of the first form in which the entire cell is reflected about the wire access in the cell placement 52 (including the boundary regions being reflected). Since the reflected cell 86 is a complete reflection of the cell, the automated design system can determine the reflected cell from the first form 80 without needing any additional cell to be modelled for the placement/routing stage. However, while this reflection may help with connection routing, it introduces boundary violations 94 at the cell boundaries.

As shown in the bottom part of FIG. 6, by providing the second form 82 of the standard cell, the reflected versions 86 of the first form 80 formed after placement and routing can be mapped to the second form 82 during the streamout step to resolve the boundary violations. The second form 82 of the cell alternative cell can be defined using relatively little characterising data (for example, the only model views required may be CDL or GDS2), avoiding the need to provide two or more full models of the same cell at the placement or routing step.

Figure 7:
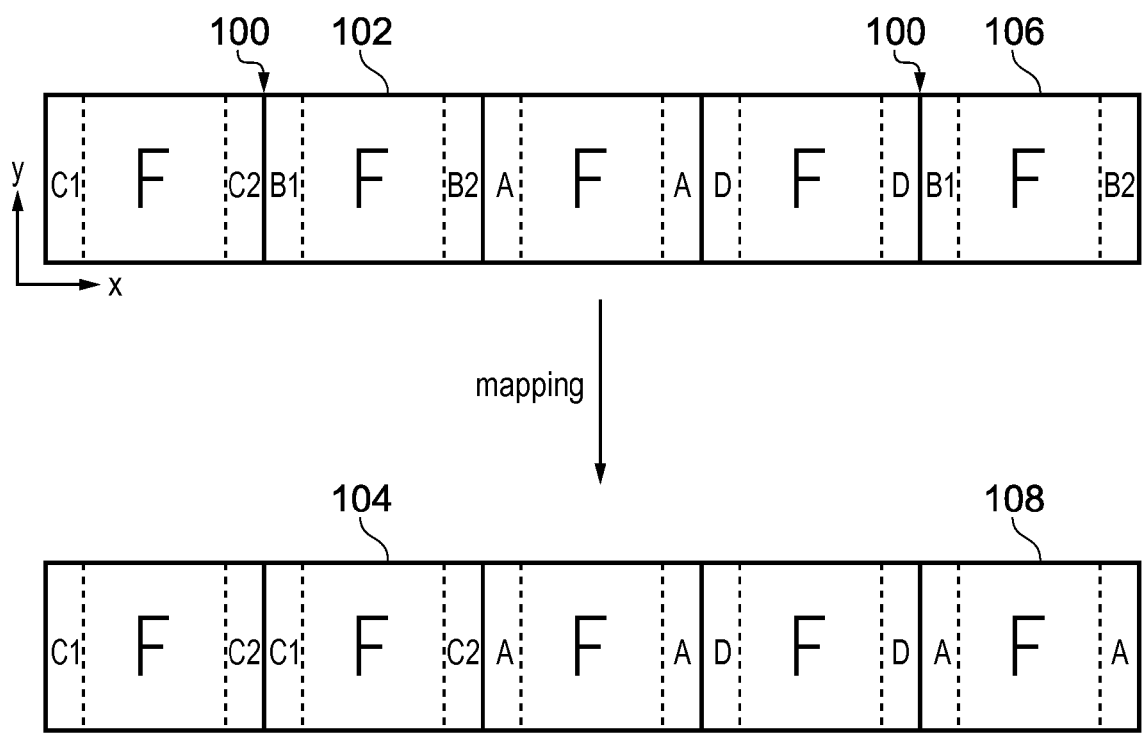
FIG. 7 shows a second example of mapping incompatible boundary regions to compatible alternative boundary regions.

FIG. 7 shows a second example of mapping boundary regions to alternative boundary regions. In this example, rather than selecting between only two forms of the cell, there may be multiple available cells to choose from. For example, where cells can have boundary regions of different type shown in FIG. 1A to 1D then there may be a range of different types of boundary violation that may occur. The top part of FIG. 7 shows an example in which boundary violations 100 occur at cell boundaries C2-B1 and D-B1 because of metal exposures entering the boundary regions from both sides of the boundary at corresponding points along the Y axis. As shown in the bottom part of FIG. 7, by mapping cell 102 with boundary types B1, B2 to cell 104 with boundary types C1, C2 and mapping cell 106 with boundary types B1, B2 to cell 108 with boundary types A, A, these boundary violations can be resolved.

While FIG. 7 shows an example in which the entire cell is replaced in the mapping step, it may also be possible to provide a system which can replace only the cell boundary part of a cell without replacing the rest of the cell. Hence, there may be multiple edge types that can be implemented for the same cell at the mapping stage.

Also, it is possible to mix cells having multiple boundary types with cells only having a single boundary type and other cells not having any boundary type limitations as desired, simply by placing the cells where desired at the placement step (ignoring any boundary violations) and then mapping boundary regions to alternative boundary regions at a later step if required.

Figure 8:
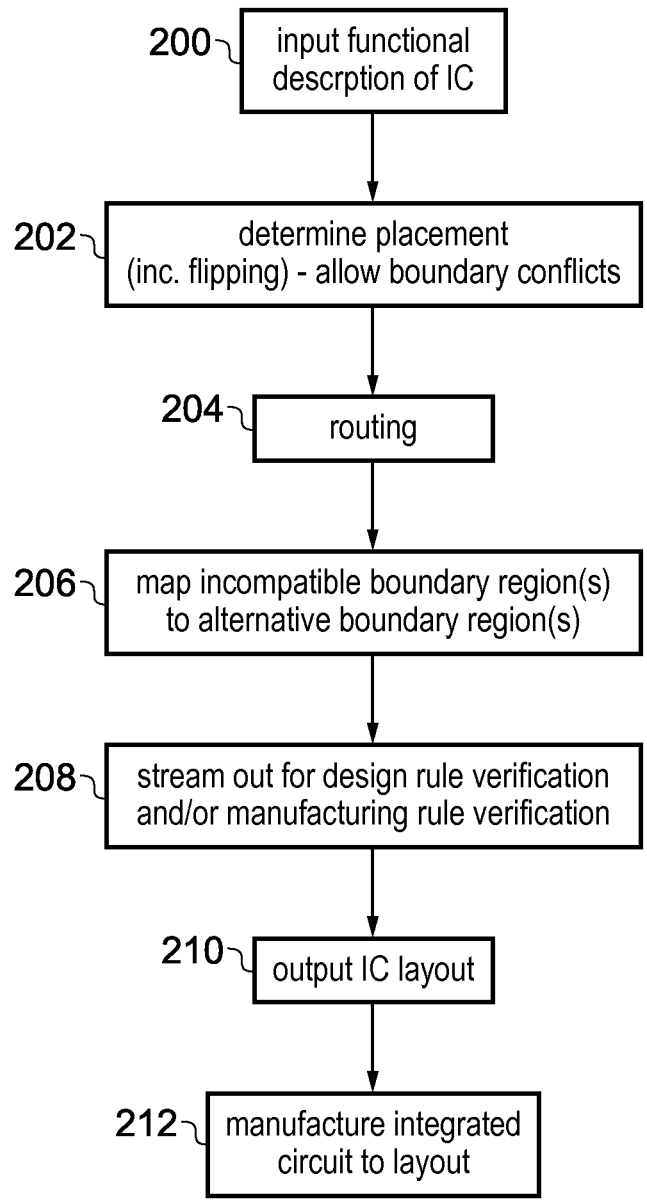
FIG. 8 illustrates a method of generating an integrated circuit layout.

FIG. 8 is a flow diagram illustrating a method of generating an integrated circuit layout. At step 200, a functional description of the integrated circuit to be generated is input. At step 202 the placement 52 of standard cells from the library 42 is determined. The placement step includes optionally flipping (reflecting) one or more cells about an axis, for example to improve routing efficiency. The placement step allows cells to be placed such that there are boundary conflicts where incompatible boundary regions are placed next to each other. At step 204, the routing connections 60 are determined to interconnect different cells of the cell placement 52. At step 206, one or more incompatible boundary regions which conflict with adjacent boundary regions are mapped to alternative boundary regions which resolve the conflict. This step may use compatibility information, indicating which types of cell boundaries conflict with other types of cell boundaries, to determine where boundary conflicts arise and how to resolve them using alternative boundary regions. At step 208 the cell placement 52 with boundary regions mapped to alternative regions as in step 206 is streamed out for design rule verification and/or manufacturing rule verification. The design rule verification and manufacturing rule verification are similar but may perform slightly different check for compliance with any design/manufacturing constraints. At step 210 the streamed out integrated circuit layout is output, for example using a storage medium or communication device. The layout can then be supplied to a manufacturer or manufacturing device and at step 212 the integrated circuit is manufactured to the layout generating in the preceding steps. While steps 206 and 208 are shown as separate steps in FIG. 8, in other examples they may combined in the same step.

Figure 9:
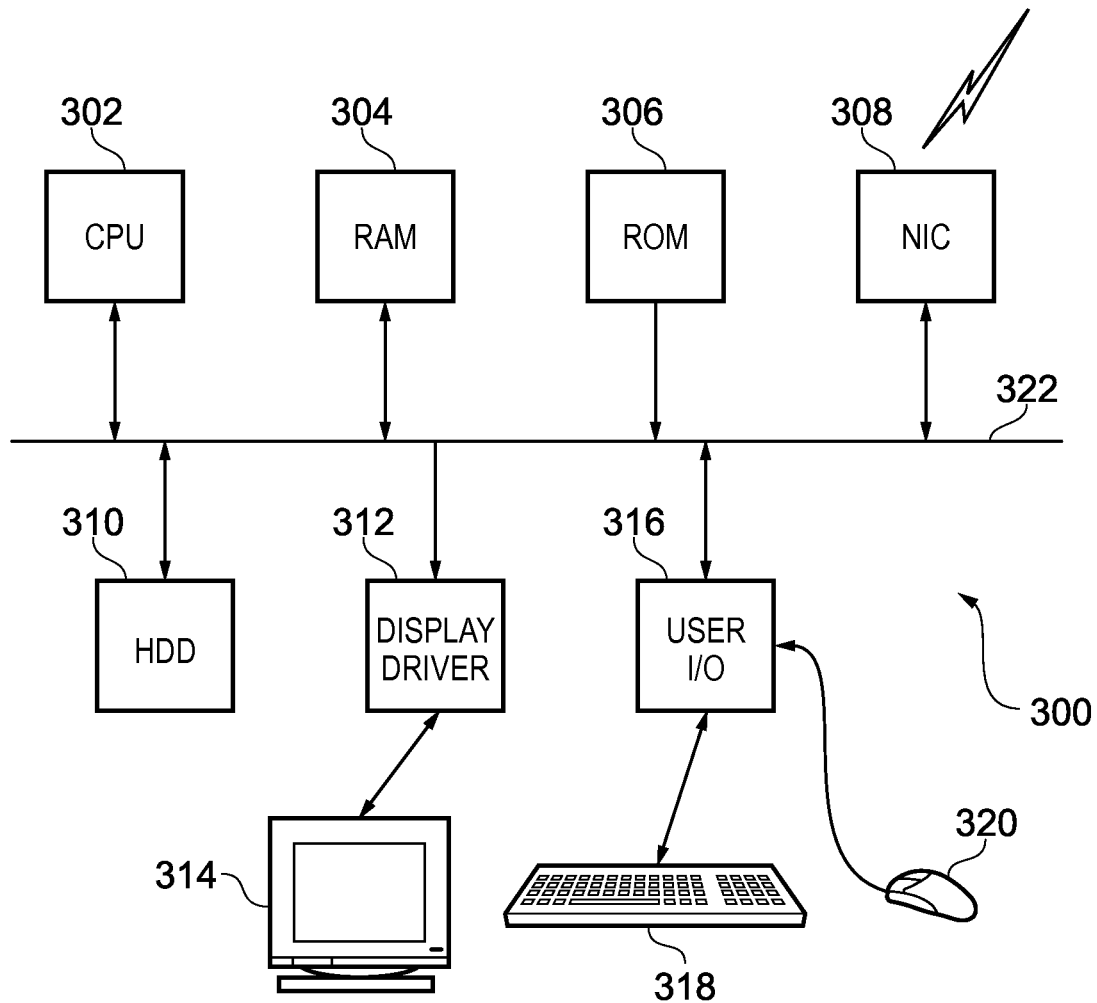
FIG. 9 schematically illustrates an example of a computer system for performing the method.

FIG. 9 schematically illustrates an example of a general purpose computer 300 that may be used to implement the above described techniques and in particular the generation of a layout of an integrated circuit. The general purpose computer 300 includes a central processing unit 302, a random access memory 304, a read only memory 306, a network interface card 308, a hard disk drive 310, a display driver 312 and monitor 314 and a user input/output circuit 316 with a keyboard 318 and mouse 320 all connected via a common bus 322. In operation the central processing unit 302 may execute computer program instructions that may be stored in one or more of the random access memory 304, the read only memory 306 and the hard disk drive 310 or dynamically downloaded via the network interface card 308. The results of the processing performed may be displayed to a user via the display driver 312 and the monitor 314. User inputs for controlling the operation of the general purpose computer 300 may be received via the user input output circuit 316 from the keyboard 318 or the mouse 320. It will be appreciated that the computer program could be written in a variety of different computer languages. The computer program may be stored and distributed on a recording medium or dynamically downloaded to the general purpose computer 300. When operating under control of an appropriate computer program, the general purpose computer 300 can perform the above described techniques and can be considered to form an apparatus for performing the above described technique. The architecture of the general purpose computer 300 could vary considerably and FIG. 9 is only one example.

Although particular embodiments of the present technique have been described herein, it will be apparent that the invention is not limited to these, and that many modifications and additions may be made within the scope of the invention. For example, various combinations of the features of the following dependent claims may be made without departing from the scope of the invention.

We claim:

1. A computer-implemented method of generating an integrated circuit layout using a standard cell library defining a plurality of standard cells, each standard cell defining a functional component for including in the integrated circuit layout, the method comprising steps of:

determining a placement of standard cells selected from the standard cell library while permitting one or more boundary conflicts in which incompatible boundary regions are placed adjacent to each other in adjacent standard cells of the placement, the incompatible boundary regions comprising boundary regions that cannot be placed adjacent to each other in the integrated circuit layout;

determining routing connections between the standard cells in the placement; and using a computer, generating the integrated circuit layout based on the placement and the routing connections, wherein said generating comprises a mapping step in which, for at least one of the boundary conflicts, at least one of the incompatible boundary regions in the placement is mapped to an alternative boundary region in the integrated circuit layout to resolve the boundary conflict;

wherein the mapping step comprises replacing a target standard cell of the placement comprising said at least one of the incompatible boundary regions with an alternative standard cell in the integrated circuit layout comprising the alternative boundary region and the same functional component as the target standard cell, wherein the alternative standard cell comprises the functional component in the same orientation as the target standard cell.

2. The method according to claim 1, wherein the step of determining the placement comprises placing a reflected cell in the placement, the reflected cell comprising a reflected version of a selected standard cell from the standard cell library.

3. The method according to claim 2, wherein the reflected cell is formed by reflecting the functional component and boundary regions of the selected standard cell to form the reflected cell.

4. The method according to claim 1, wherein the step of determining the placement comprises placing the standard cells with the incompatible boundary regions for at least one boundary conflict directly abutting each other in the placement.

5. The method according to claim 1, wherein the target standard cell comprises a first boundary region at a first edge of the standard cell and a second boundary region at a second edge of the standard cell opposite the first edge; and the alternative standard cell comprises the second boundary region at the first edge of the standard cell and the first boundary region at the second edge of the standard cell.

6. The method according to claim 5, wherein the target standard cell comprises a reflected version of a selected standard cell from the standard cell library, the selected standard cell comprising the second boundary region at the first edge, the first boundary region at the second edge, and a predetermined functional component between the first edge and the second edge; and the alternative standard cell comprises a reflected version of the predetermined functional component between the first edge and the second edge.

7. The method according to claim 1, wherein the mapping step is performed at a step for outputting the integrated circuit layout for design rule verification or manufacturing rule verification.

8. The method according to claim 1, wherein the mapping step maps the at least one of the incompatible boundary regions to the alternative boundary region based on compatibility information indicative of compatibility between boundary regions of a plurality of different types.

9. The method according to claim 1, comprising a step of outputting the generated integrated circuit layout.

10. The method according to claim 1, comprising a step of manufacturing an integrated circuit having the generated integrated circuit layout.

11. An integrated circuit manufactured according to the method of claim 10.

12. A computer configured to perform the method of claim 1.

13. A non-transitory computer-readable storage medium storing a standard cell library comprising information defining a plurality of standard cells for inclusion in an integrated circuit layout, each standard cell comprising a first edge and a second edge opposite the first edge;

said plurality of standard cells comprising:
a first standard cell comprising a first boundary region at the first edge, a second boundary region at the second edge and a predetermined functional component between the first edge and the second edge; and
a second standard cell comprising the first boundary region at the first edge, the second boundary region at the second edge, and a reflected version of the predetermined functional component between the first edge and the second edge.

14. The non-transitory computer-readable storage medium according to claim 13, wherein the standard cell library comprises control information for controlling placement and connection routing for both the first standard cell and the second standard cell.

15. The non-transitory computer-readable storage medium according to claim 13, wherein the standard cell library comprises control information for controlling placement and connection routing for the first standard cell but not the second standard cell.

16. The non-transitory computer-readable storage medium according to claim 15, wherein the standard cell library comprises control information for controlling replacement of a reflected version of the first standard cell with the second standard cell following placement and connection routing.

* * * * *